(12) United States Patent
Yoshida et al.

(10) Patent No.: US 6,288,887 B1
(45) Date of Patent: Sep. 11, 2001

(54) CERAMIC ELECTRONIC COMPONENT

(75) Inventors: Kazuhiro Yoshida, Shimane-ken; Nobushige Moriwaki; Yasuhiko Kubota, both of Izumo, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/501,161

(22) Filed: Feb. 9, 2000

(30) Foreign Application Priority Data

Feb. 16, 1999 (JP) .................................................. 11-36880

(51) Int. Cl.⁷ .............................. H01G 4/228; H01G 4/00
(52) U.S. Cl. .................................. 361/306.1; 361/306.3; 361/309; 361/321.2
(58) Field of Search ......................... 361/306.1, 301.4, 361/304, 308.1, 309, 310, 321.2; 29/25.41, 25.42

(56) References Cited

U.S. PATENT DOCUMENTS 6,046,902 * 4/2000 Nakagawa et al. ............... 361/306.1
6,181,544 * 1/2001 Nakagawa et al. ............... 361/321.1

FOREIGN PATENT DOCUMENTS 2327631   2/1999 (GB) .
11-40454 * 2/1999 (JP) .

* cited by examiner

Primary Examiner—Anthony Dinkins
(74) Attorney, Agent, or Firm—Ostrolenk, Faber, Gerb & Soffen, LLP

(57) ABSTRACT

A ceramic electronic component satisfies a condition expressed by $$H1 \geq 0.03L,$$

wherein $H1$ is the distance between the surface of a substrate on which the ceramic electronic component is mounted and a point P at which outer terminals connecting the ceramic electronic component to the substrate first contacts the side surfaces of the ceramic electronic component and L is the length of the ceramic electronic component. The ceramic electronic component also satisfies a condition expressed by $$H2 \geq 2t$$

wherein $H2$ is the distance from a lower surface of the ceramic electronic element 4 to the surface of the substrate 7 and $t$ is the thickness of the outer terminals.

28 Claims, 3 Drawing Sheets ly, the invention relates to a terminal-mounted
CERAMIC ELECTRONIC COMPONENT

BACKGROUND OF THE INVENTION

1. Field of the Invention

The present invention relates to a ceramic electronic component, such as a multilayer ceramic capacitor; particularly, the invention relates to a terminal-mounted ceramic electronic component that has outer terminals for mounting a substrate on a ceramic electronic component element.

2. Description of the Related Art

Typical ceramic electronic components or multilayer ceramic capacitors include a type which has a structure such as that shown in FIG. 5. The structure has multiple inner electrodes 52 opposing each other via a ceramic layer 51, one end of each of the electrodes extends, in alternating fashion, to opposite end surfaces of a ceramic electronic component element 54. The structure also has a pair of outer electrodes 53 arranged on opposite end surfaces so as to be electrically connected to exposed portions of the inner electrodes 52. In addition, the structure has outer terminals 55 formed by bent metal plates connected to the outer electrodes 53 by a connecting material 56, such as a solder, an electrically conductive adhesive, or an electrically conductive paste.

Another type of the typical multilayer ceramic capacitor has the structure as shown in FIG. 6. In this structure, outer terminals 55 are connected to an electronic element 64 (stacked element) formed by stacking multiple ceramic electronic elements 54. A connecting material 56, similar to that used in the above type (such as a solder, an electrically conductive adhesive, or an electrically conductive paste) is used to connect the outer terminals 55 to the ceramic electronic elements 54. Outer electrodes 53 are formed on the electronic component element 64 so as to be electrically connected to inner electrodes 52 arranged in a ceramic 51.

The components described above, however, have certain drawbacks. For example, the terminal-mounted multilayer ceramic capacitor shown in FIG. 5 exhibits insufficient strength to withstand certain levels of substrate deflection. A substrate-deflection testing was performed in accordance with requirements stipulated in Japanese Industrial Standards (JIS). The test was performed on the capacitor in a condition where the outer terminals 55 were connected to a printed circuit board 57. During which test, depending on a thickness t of the outer terminal 5, an elevation height H (distance in which each of the outer terminal 55 extends from a lower surface of the ceramic electronic element 54), and a length L of the ceramic electronic element 54, the strength of the structure is found to be insufficient to withstand a specified substrate deflection. At times, cracks C were created at portions near individual lower end surfaces of the end surfaces to which the outer terminals 55 are connected (force-exerted points).

The above problem is particularly problematic in large ceramic electronic components. In large components, since a distance L between the outer terminals (interterminal distance) is proportionally long, cracks are likely to occur, i.e., damage is likely to result. These problems can also arise with the stacked type of the ceramic electronic component shown in FIG. 6.

SUMMARY OF THE INVENTION

An object of the present invention is to solve the problems described above by providing a ceramic electronic component having a high strength against deflection of the substrate, thereby enjoying high reliability.

In order to solve the above described problems, the inventors carried out various experiments and studies. As a result, they learned that the relationship between the distance H1 from the surface of the substrate to the point at which the outer terminals first contact the side surfaces of the electronic component and the length L of the electronic component element (as measured between the electrodes formed on its end surfaces) significantly affects the strength against deflection of the substrate of the ceramic electronic component. Based on this finding, the team further carried out experiments and studies, thereby making the present invention.

The ceramic electronic component of the present invention comprises:

a substantially rectangular ceramic electronic component having opposite side surfaces defined by respective outer electrodes which are substantially parallel to one another and are spaced apart by a length L, the electronic component also having a bottom surface extending between the side surfaces substantially perpendicularly thereto;

a pair of outer terminals connected to respective ones of the opposite end surfaces of the electronic component, each of the outer terminals extending below the bottom surface of the electronic component and terminating in surface mounting portions whose bottom surfaces extend in a common plane lying substantially parallel to the bottom surface of the electronic component, the distance from the common plane to the point at which the outer terminals first contact the side surfaces of the electronic component being H1, the distance from the common plane to the bottom surface of the electronic component being H2, each of the outer terminals having a thickness t, the electronic component and outer terminals having the relationship:

$$H1 \geq 0.03L \text{ and } H2 \geq 2t.$$

The force-exertion point (the point where a force is exerted from the outer terminal to the electronic component element) in the present invention is a concept signifying a point where the deflection stress caused by the substrate being stressed reaches the electronic component through the outer terminal. As a general rule, the force-exertion point will be the point at which the outer terminals as measured from the substrate first contacts the side surfaces of the electronic component element.

In the above, the outer terminals may be formed of a material selected from alloys containing a main component of at least one of Cu, Ni, Al, Ag, and Fe. With the outer terminals formed in this way, required mechanical strengths can be ensured, and concurrently, electrical-current capacitance can be ensured. This allows the present invention to be even more practically efficient.

Also, the length L of the electronic component element may be 3 to 50 mm, or more preferably, 10 to 50 mm. By applying the present invention to ceramic electronic components in which the distance between the outer terminals is arranged as described above, the strength against deflection of the substrate in large terminal-mounted ceramic electronic components which frequently cause problems of destruction due to deflection of their substrates can be improved. This allows the present invention to be even more practically efficient.

Also, in the ceramic electronic component described above, the pair of outer terminals may be soldered with the electronic component element. Generally, outer terminals are soldered with electronic component elements. The present invention also employs the soldering method, thereby allowing ceramic electronic components of various types to have an improved strength against deflection of their substrates. This also allows the invention to be even more practically efficient.

Furthermore, surfaces of the outer terminals may be plated or coated with at least one material selected from Au, Ni, Sn, and a solder. Generally, outer terminals are plated or coated with the aforementioned material to improve performance and soldering characteristics. Therefore, the present invention can be suitably to a wide range of ceramic electronic components with such outer terminals. This results in provision of a wide range of ceramic electronic components improved in the strength against deflection of their substrates.

BRIEF DESCRIPTION OF THE DRAWINGS

Other features and advantages of the present invention will become apparent from the following description of the invention which refers to the accompanying drawings.

DESCRIPTION OF THE PREFERRED EMBODIMENTS

The present invention will be further illustrated with embodiments described below.

[Embodiment 1]

Figure 1:
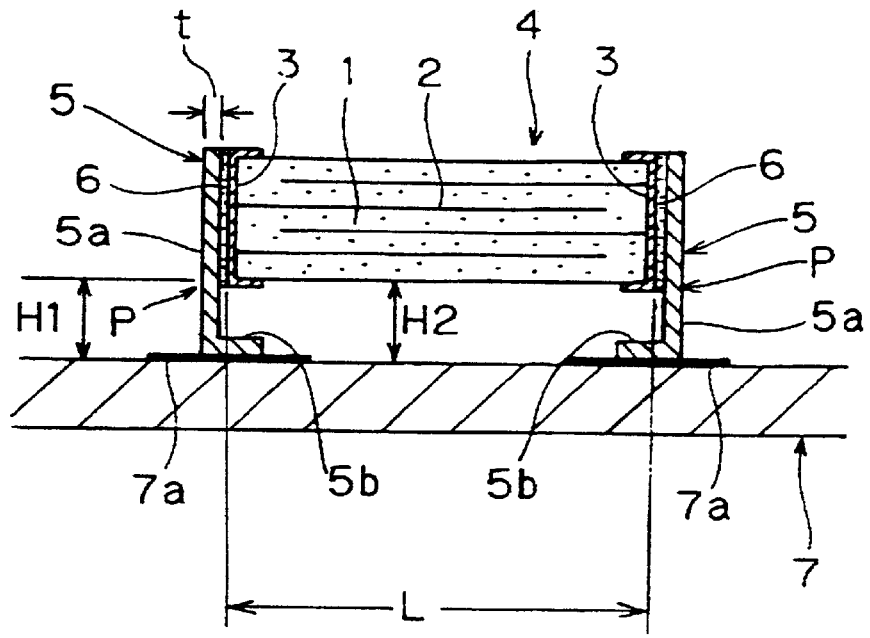
FIG. 1, is a cross-sectional of a ceramic electronic component according to an embodiment 1 of the present invention.

FIG. 1 is a cross-sectional view of the ceramic terminal-mounted multilayer ceramic capacitor (more generally a ceramic electronic component) of a first embodiment of the present invention.

As shown in FIG. 1, the ceramic electronic component has multiple inner electrodes 2 which are arranged so to oppose each other via respective ceramic layers. One end of each electrode 2 extends to either the left or the right end surface of the ceramic electronic component element 4 in an alternating fashion so as to be exposed at the surface to which it extends. A pair of outer electrodes 3 are arranged on opposite end surfaces so as to be electrically connected to exposed portions of the inner electrodes 2. In addition, outer terminals 5, preferably formed by bent metal plates, are connected to the outer electrodes 3 by a suitable connecting material 6, such as a solder, an electrically conductive adhesive, or an electrically conductive paste.

In the preferred embodiment, the outer terminals 5 are formed of a metal plate made, for example, of gold which is bent at and angle of 90 degrees at one end thereof. Each of the outer terminals 5 has a vertical section 5a connected to the electronic component element 4 and a horizontal terminal mounting portion 5b connected to a substrate 7, such as a printed board. The bottom of the terminal mounting portions 5b lie in a common plane lying substantially parallel to the bottom surface of the electronic component element 4.

The ceramic electronic component is configured so as to satisfy two conditions described below.

One condition is that the following relationship between a distance H1 and a length L (the distance between the outer surfaces of the outer electrodes 4 of the component 3) of the electronic component element 4 is satisfied $$H1 \geq 0.03L$$

wherein H1 is the distance from the surface of the substrate 7 to the point P (the force-exertion point) at which the outer terminal 5 first contacts the electronic component element 4 (actually, first contacts the outer electrodes 3 of the electronic component element 4) and a force is exerted from the outer terminal 5 to the side surface of the electronic component element 4. If the left and right outer terminals contact the electronic component element 4 at different points, then only the shorter terminal must satisfy this requirement.

Another condition which is preferably met is that the following relationship between distance H2 from the surface of the substrate 7 to a lower surface of the electronic component element 4 (which is the same as the height H1 of the force-exerted point P in the first embodiment) and thickness t of the outer terminals 5 is satisfied $$H2 \geq 2t.$$

In the case where the left and right outer terminals are of different thickness, only the thicker terminal must satisfy this requirement.

When these conditions are met, it has been determined that when the ceramic electronic component 4 is mounted by soldering the terminal mounting portions 5b to a land 7a of the substrate 7, destruction due to cracking does not occur even when, for example, deflection of the substrate 7 exceeds a predetermined value. This results in improvement in the strength against deflection of the substrate 7.

Table 1 below shows the relationship between H1 and L and the relationship between ratio of the occurrence of a predetermined deflection in the substrate 7 and the resultant damage in the ceramic electronic component under the condition wherein the relationship between H2 and t is varied in cases of ceramic electronic components having a configuration similar to that of the above described ceramic electronic component.

TABLE 1

| H2/t | Damage occurrence ratios (%) H1/L | | | | | |
|------|------|------|------|------|------|------|
|      | 0.00 | 0.01 | 0.02 | 0.03 | 0.05 | 0.10 |
| 0.1  | 100  | —    | —    | —    | 0    | —    |
| 0.5  | —    | 85   | 50   | 30   | 20   | 10   |
| 1.0  | —    | 65   | 30   | 5    | 5    | 2    |
| 1.5  | —    | 5    | 20   | 8    | 3    | 0    |
| 2.0  | —    | 30   | 5    | 0    | 0    | 0    |
| 3.0  | —    | —    | 5    | 0    | 0    | 0    |
| 5.0  | —    | —    | 3    | 0    | 0    | 0    |

In this table, the dashes indicate that no tests were performed for the variables noted. In each of the noted tests, the deflection mode was the same. However, the size of the deflection sometimes varied. The size of the deflection was not evaluated. An evaluation was performed depending on whether there was deflection or not.

As can be seen from Table 1, in ceramic electronic components satisfying the two conditions expressed by $$H1 \geq 0.03L \text{ and } H2 \geq 2t,$$

no damage occurs, and the strength against deflection of their substrates thereof is significantly improved.

[Embodiment 2]

Figure 2:
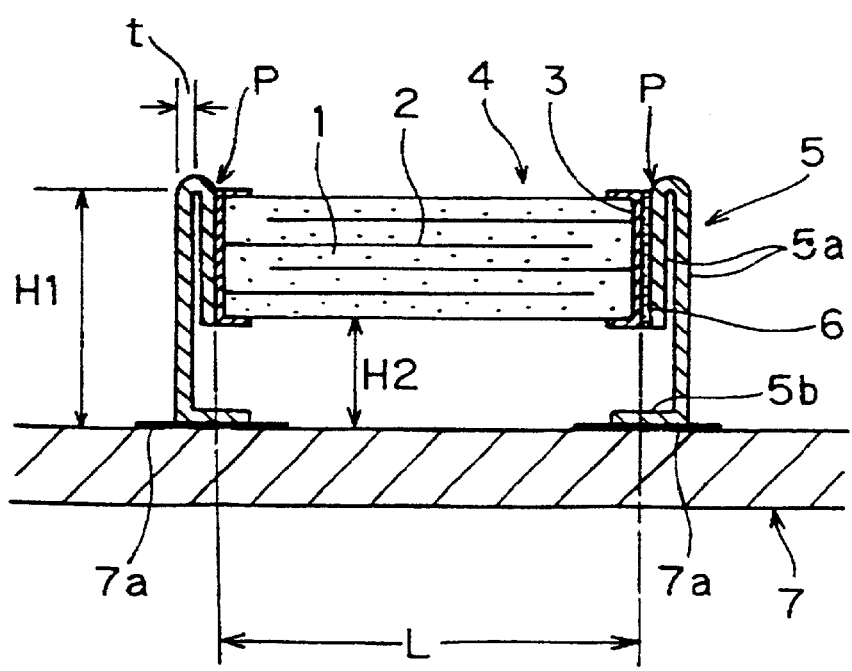
FIG. 2 is a cross-sectional view of the ceramic electronic component according to an embodiment 2 of the present invention.

FIG. 2 is a cross-sectional view of a second embodiment of a ceramic electronic component of the present invention.

In this embodiment, each of the vertical sections 5a of outer terminals 5 is bent 180 degrees to form a pair of substantially parallel sections, one of which is connected to a respective end surface of the ceramic electronic component element 4. In this embodiment, each force-exertion point P is located at an upper end portion of an end surface of an electronic component element 4.

This embodiment also satisfies the condition $$H1 \geq 0.03L$$

regarding the relationship between height H1 of the force-exertion point P and length L of the electronic component element 4. Concurrently, this embodiment satisfies the condition $$H2 \geq 2t$$

regarding the relationship between distance H2 from a lower surface of the electronic component element 4 to a surface of a substrate 7 and thickness t of the outer terminal 5.

Other portions of this embodiment are similar to those in the embodiment 1 and their description is omitted to avoid redundancy. Portions identified with identifying characters as those in FIG. 2 are the same as or equivalent to the corresponding portions in FIG. 1.

The ceramic electronic component of the second embodiment also satisfies conditions expressed by $$H1 \geq 0.03L \text{ and } H2 \geq 2t,$$

therefore improving the strength against deflection of the substrate 7.

[Embodiment 3]

Figure 3:
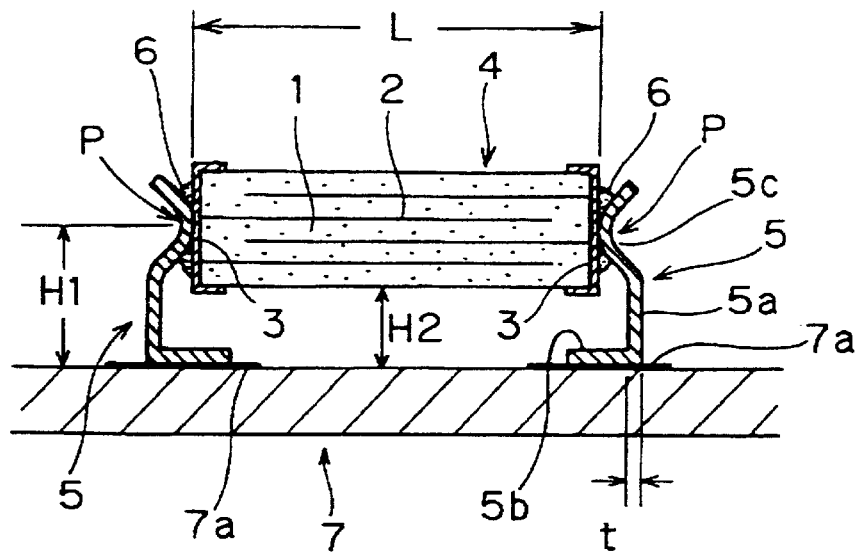
FIG. 3 is a cross-sectional view of the ceramic electronic component according to an embodiment 3 of the present invention.

FIG. 3 is a cross-sectional view of a third embodiment of a ceramic electronic component of the present invention.

In this embodiment, a part of each individual vertical section 5a of outer terminals 5 is bent so as to define a section to be connected to an end surface of a ceramic electronic component element 4. Therefore, in the ceramic electronic component 4 of the embodiment 3, each force-exertion point P is located at the location where the bent section 5c is first connected to an end surface of the electronic component element 4 with a connecting material 6 (e.g., solder).

The embodiment 3 is also configured so that height H1 of the force-exertion point P and length L of the electronic component element 4 satisfy the condition expressed by $$H1 \geq 0.03L.$$

It is also configured so that distance H2 from a lower surface of the electronic component element 4 to the bottom surface of the substrate 7 and thickness t of the outer terminal 5 satisfy the condition $$H2 \geq 2t.$$

Other portions in this embodiment are similar to those of embodiment 1 and their description is omitted to avoid redundancy. Portions of FIG. 3 identified with the same identifying characters as those in FIG. 1 are the same as or equivalent to the corresponding portions in FIG. 1.

Thus, the ceramic electronic component of the embodiment 3 also satisfies conditions $$H1 \geq 0.03L \text{ and } H2 \geq 2t,$$

therefore improving the strength against deflection of the substrate 7.

[Embodiment 4]

Figure 4:
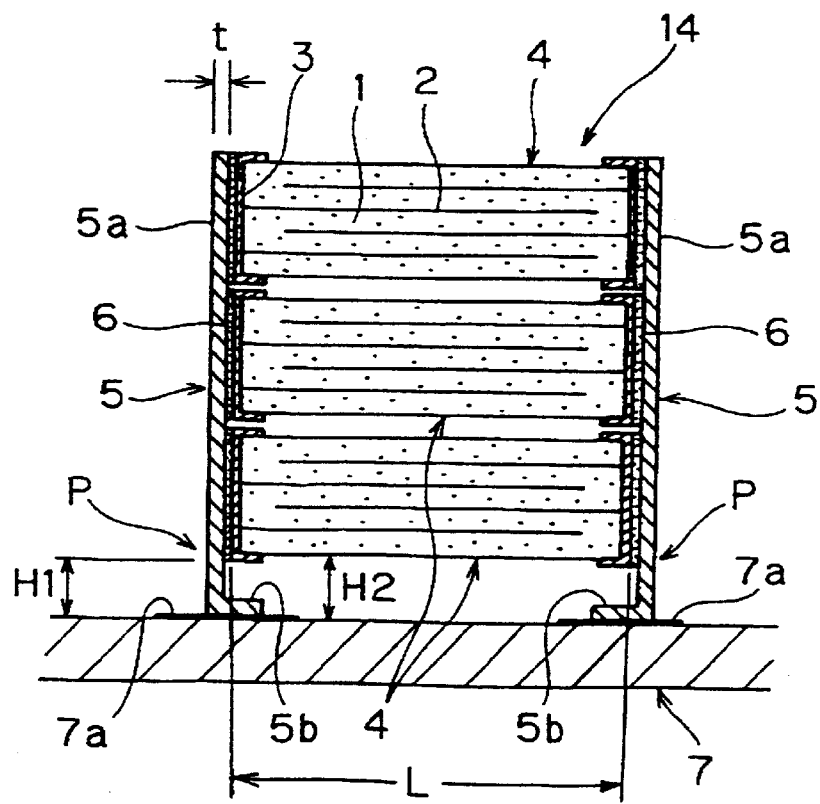
FIG. 4 is a cross-sectional view of the ceramic electronic component according to an embodiment 4 of the present invention.
Figure 5:
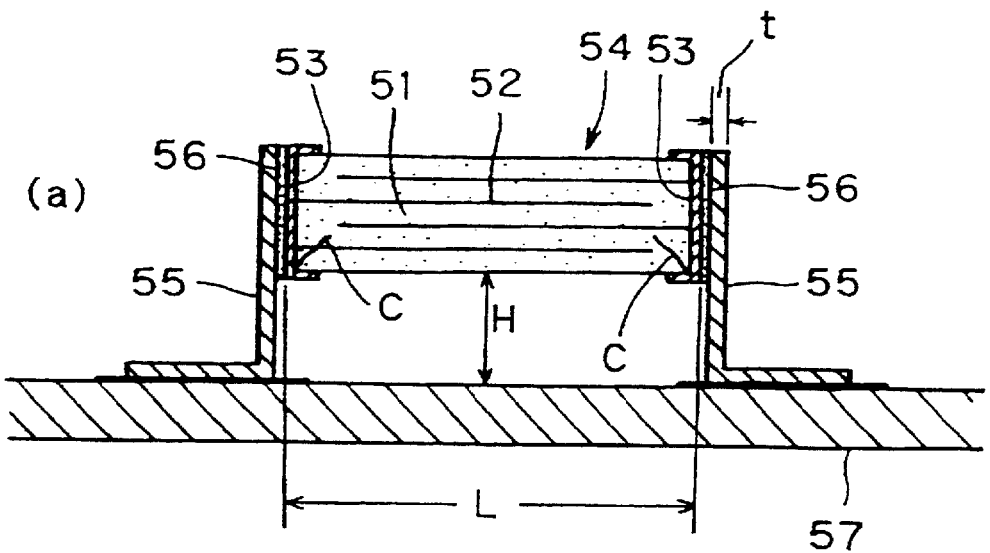
FIG. 5 is a cross-sectional view of a conventional ceramic electronic component.
Figure 6:
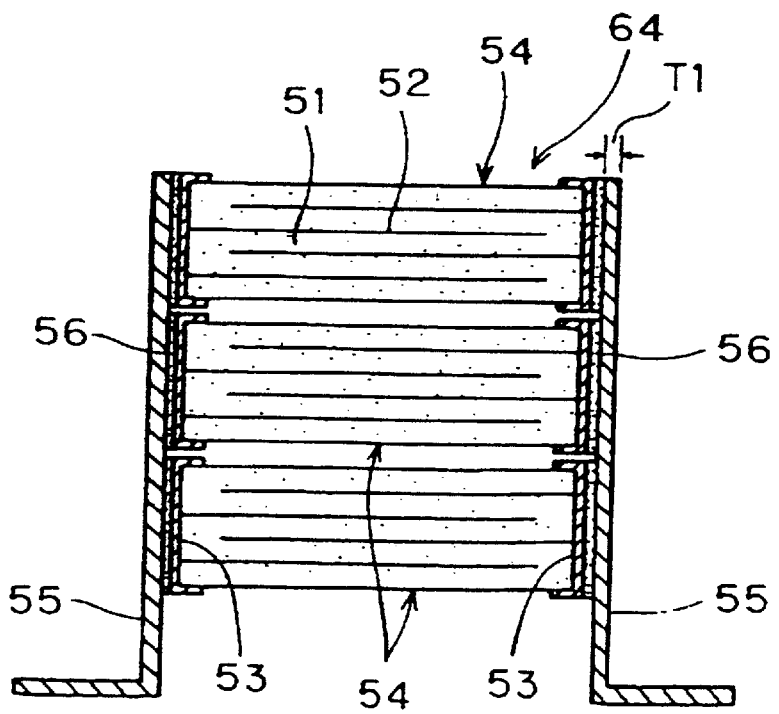
FIG. 6 is a cross-sectional view of a conventional ceramic electronic component.

FIG. 4 is a cross-sectional view of a fourth embodiment of a ceramic electronic component of the present invention. The ceramic electronic component is formed by connecting outer terminals 5 on opposite end surfaces of a stacked element 14 formed by stacking a plurality of ceramic electronic component elements 4, each having the same configuration as one of those of the above-described embodiments 1 to 3. In the ceramic electronic component of the fourth embodiment, each force-exertion point P is located at the portion of outer terminal 5 which first contacts the electronic component element 4.

The fourth embodiment is also configured so that height H1 of force-exerted point P and length L of the electronic component element 4 satisfy the condition $$H1 \geq 0.03L,$$

and distance H2 from a lower surface of the electronic component element 4 to a surface of a substrate 7, and thickness t of the outer terminal 5 satisfy the condition $$H2 \geq 2t.$$

Other portions of embodiment 4 are similar to the embodiment 1 and their description is omitted to avoid redundancy. Portions identified with the same identifying characters as those in FIG. 1 are the same as or equivalent to the corresponding portions in FIG. 1.

The ceramic electronic component of the above embodiment 4 also satisfies conditions $$H1 \geq 0.03L \text{ and } H2 \geq 2t,$$

therefore allowing the strength against deflection of the substrate to be improved.

For the described embodiments 1 to 4, a description has been made with reference to multilayer ceramic capacitors as examples. However, the invention may be applied to not only multilayer ceramic capacitors, but also various other ceramic electronic components having a structure in which outer terminals are connected to opposite end surfaces of their electronic component elements.

For other items as well, the present invention is not restricted to the above-described embodiments, but various other applications and modifications may be provided to the invention with respect to, for example, the specific shape, structure, and arrangement position of the outer terminals, and method of connection thereof to the electronic component element within the spirit and scope of the present invention.

What is claimed is:

1. A ceramic electronic component, comprising:

a substantially rectangular ceramic electronic component having opposite end surfaces defined by respective outer electrodes which are substantially parallel to one another and are spaced apart by a length L, the electronic component also having a bottom surface extending between the end surfaces substantially perpendicularly thereto;

a pair of outer terminals connected to respective ones of the opposite end surfaces of the electronic component, each of the outer terminals extending below the bottom surface of the electronic component and terminating in surface mounting portions whose bottom surfaces extend in a common plane lying substantially parallel to the bottom surface of the electronic component, the distance from the common plane to the point at which the outer terminals first contact the end surfaces of the electronic component being H1, the distance from the common plane to the bottom surface of the electronic component being H2, each of the outer terminals having a thickness t, the electronic component and outer terminals having the relationship:

$H1 \geq 0.03L$ and $H2 \geq 2t$.

2. A ceramic electronic component according to claim 1, wherein the outer terminals are formed of a material selected from alloys containing a main component of at least one of Cu, Ni, Al, Ag and Fe.

3. A ceramic electronic component according to claim 2, wherein L is between 3 and 50 mm.

4. A ceramic electronic component according to claim 1, wherein L is between 3 and 50 mm.

5. A ceramic electronic component according to claim 1, wherein L is between 10 and 50 mm.

6. A ceramic electronic component according to claim 2, wherein L is between 10 and 50 mm.

7. A ceramic electronic component according to claim 1, wherein the pair of outer terminals are soldered to the end surfaces of the electronic component.

8. A ceramic electronic component according to claim 2, wherein the pair of outer terminals are soldered to the end surfaces of the electronic component.

9. A ceramic electronic component according to claim 3, wherein the pair of outer terminals are soldered to the end surfaces of the electronic component.

10. A ceramic electronic component according to claim 4, wherein the pair of outer terminals are soldered to the end surfaces of the electronic component.

11. A ceramic electronic component according to claim 5, wherein the pair of outer terminals are soldered to the end surfaces of the electronic component.

12. A ceramic electronic component according to claim 6, wherein the pair of outer terminals are soldered to the end surfaces of the electronic component.

13. A ceramic electronic component according to claim 1, wherein surfaces of the outer terminals are either plated or coated with at least one material selected from Au, Ni, Sn and solder.

14. A ceramic electronic component according to claim 2, wherein surfaces of the outer terminals are either plated or coated with at least one material selected from Au, Ni, Sn and solder.

15. A ceramic electronic component according to claim 3, wherein surfaces of the outer terminals are either plated or coated with at least one material selected from Au, Ni, Sn and solder.

16. A ceramic electronic component according to claim 7, wherein surfaces of the outer terminals are either plated or coated with at least one material selected from Au, Ni, Sn and solder.

17. A ceramic electronic component according to claim 13, wherein surfaces of the outer terminals are either plated or coated with at least one material selected from Au, Ni, Sn and solder.

18. A ceramic electronic component according to claim 1, wherein each of the outer terminals is bent into a U-shape with a pair of parallel legs, a first of the legs being coupled to a respective end surface of the electronic components, a second of the legs being spaced from the first leg.

19. The combination of a ceramic electronic component and a substrate, the combination comprising:

a substrate having a substantially planar mounting surface;

a substantially rectangular ceramic electronic component having opposite end surfaces defined by respective outer electrodes which are substantially parallel to one another and are spaced apart by a length L, the electronic component also having a bottom surface extending between the end surfaces substantially perpendicularly thereto;

a pair of outer terminals connected to respective ones of the opposite end surfaces of the electronic component, each of the outer terminals extending below the bottom surface of the electronic component and being coupled to the mounting surface of the substrate, the distance from the mounting surface of the substrate to the point at which the outer terminals first contact the end surfaces of the electronic component being H1, the distance from the planar substrate to the bottom surface of the electronic component being H2, each of the outer terminals having a thickness t, the electronic component, the outer terminals and the mounting surface of the substrate having the relationship:

$H1 \geq 0.03L$ and $H2 \geq 2t$.

20. The combination of claim 19, wherein the outer terminals are formed of a material selected from alloys containing a main component of at least one of Cu, Ni, Al, Ag and Fe.

21. The combination of claim 20, wherein L is between 3 and 50 mm.

22. The combination of claim 19, wherein L is between 3 and 50 mm.

23. The combination of claim 19, wherein L is between 10 and 50 mm.

24. The combination of claim 20, wherein L is between 10 and 50 mm.

25. The combination of claim 19, wherein the pair of outer terminals are soldered to the end surfaces of the electronic component.

26. The combination of claim 20, wherein the pair of outer terminals are soldered to the side surfaces of the electronic component.

27. The combination of claim 19, wherein surfaces of the outer terminals are either plated or coated with at least one material selected from Au, Ni, Sn and solder.

28. The combination of claim 19, wherein each of the outer terminals is bent into a U-shape with a pair of parallel legs, a first of the legs being coupled to a respective end surface of the electronic components, a second of the legs being spaced from the first leg.

* * * * *